(12) United States Patent
Murakami et al.

(10) Patent No.: US 7,456,417 B2
(45) Date of Patent: Nov. 25, 2008

(54) LASER PLASMA EUV LIGHT SOURCE, TARGET MATERIAL, TAPE MATERIAL, A METHOD OF PRODUCING TARGET MATERIAL, A METHOD OF PROVIDING TARGETS, AND AN EUV EXPOSURE DEVICE

(75) Inventors: Katsuhiko Murakami, Kanagawa (JP); Hideya Inoue, Yokohama (JP)

(73) Assignee: Nikon Corporation, Tokyo (JP)

( * ) Notice: Subject to any disclaimer, the term of this patent is extended or adjusted under 35 U.S.C. 154(b) by 60 days.

(21) Appl. No.: 11/329,116

(22) Filed: Jan. 11, 2006

(65) Prior Publication Data

US 2007/0007469 A1   Jan. 11, 2007

(30) Foreign Application Priority Data

Jan. 12, 2005   (JP) .............................. 2005-005425

(51) Int. Cl.
   *G21G 4/00*   (2006.01)
   *G01N 21/64*   (2006.01)
   *G01J 3/10*   (2006.01)

(52) U.S. Cl. ............................... 250/504 R; 250/493.1; 250/461.1; 378/119; 378/124; 378/126; 378/143; 378/144

(58) Field of Classification Search ............. 250/504 R, 250/493.1, 461.1, 522.1, 526; 378/34, 119, 378/124–126, 143, 144; 362/216, 217, 257, 362/259

See application file for complete search history.

(56) References Cited

U.S. PATENT DOCUMENTS 4,835,120 A * 5/1989 Mallik et al. .................. 29/827
4,980,219 A   12/1990 Hiraide et al.

(Continued)

FOREIGN PATENT DOCUMENTS

EP   0 858 249 A1   8/1998

(Continued)

OTHER PUBLICATIONS

Emerging Lithographic Technologies II, Yuli Vladimirsky, vol. 3331, Proceedings of SPIE, Feb. 23-25, 1998.

(Continued)

*Primary Examiner*—Bernard E Souw
(74) *Attorney, Agent, or Firm*—Finnegan, Henderson, Farabow, Garrett & Dunner, L.L.P.

(57) ABSTRACT

Target 1 that is arranged in the disc direction is sprayed from nozzle 2 that has a slit-shaped aperture. Target 1 is conveyed on a gas stream. He gas is used in this example. Nozzle 2 may be vibrated by a piezo apparatus to spray disc-shaped target 1. Target 1 that is sprayed from nozzle 2 reaches the irradiation position of laser light with its direction unchanged since the exterior of nozzle 2 is maintained in a high vacuum. Synchronized with delivery of target 1, pulse laser light 5 from Nd:YAG light source 4 is focused by lens 3 and irradiated onto target 1. The spot diameter of the laser is the same 1 mm diameter as that of target 1. The thickness is not more than 1000 nm. Therefore, virtually the entire target is converted into plasma, debris generation is inhibited and the conversion efficiency is elevated.

39 Claims, 7 Drawing Sheets

U.S. PATENT DOCUMENTS

| | | | |
|---|---|---|---|
| 5,019,209 A * | 5/1991 | Hiraide et al. | 216/14 |
| 5,577,092 A * | 11/1996 | Kublak et al. | 378/119 |
| 6,324,255 B1 | 11/2001 | Kondo et al. | |
| 6,452,661 B1 | 9/2002 | Komatsuda | |
| 6,724,004 B2 * | 4/2004 | Yashiro | 250/504 R |
| 6,727,980 B2 * | 4/2004 | Ota et al. | 355/55 |
| 6,744,851 B2 * | 6/2004 | Orsini et al. | 378/119 |
| 6,831,963 B2 * | 12/2004 | Richardson | 378/119 |
| 6,865,255 B2 * | 3/2005 | Richardson | 378/119 |
| 6,927,405 B1 | 8/2005 | Bonnet et al. | |
| 6,977,383 B2 * | 12/2005 | Rieger et al. | 250/398 |
| 6,984,941 B2 * | 1/2006 | Hiramoto et al. | 315/111.01 |
| 6,995,382 B2 * | 2/2006 | Ziener et al. | 250/504 R |
| 7,122,816 B2 * | 10/2006 | Algots et al. | 250/504 R |
| 7,164,144 B2 * | 1/2007 | Partlo et al. | 250/504 R |
| 7,196,342 B2 * | 3/2007 | Ershov et al. | 250/504 R |
| 7,361,918 B2 * | 4/2008 | Akins et al. | 250/504 R |
| 7,388,220 B2 * | 6/2008 | Fomenkov et al. | 250/504 R |
| 2002/0094063 A1 * | 7/2002 | Nishimura et al. | 378/119 |
| 2003/0223543 A1 * | 12/2003 | Orsini et al. | 378/119 |
| 2004/0200977 A1 * | 10/2004 | Rieger et al. | 250/398 |
| 2004/0264512 A1 * | 12/2004 | Hartlove et al. | 372/5 |
| 2005/0199829 A1 * | 9/2005 | Partlo et al. | 250/504 R |
| 2005/0245382 A1 * | 11/2005 | Iwahashi et al. | 501/54 |
| 2006/0097203 A1 * | 5/2006 | Bykanov et al. | 250/504 R |
| 2006/0219957 A1 * | 10/2006 | Ershov et al. | 250/504 R |
| 2007/0001130 A1 * | 1/2007 | Bykanov et al. | 250/493.1 |
| 2007/0007469 A1 * | 1/2007 | Murakami et al. | 250/493.1 |
| 2007/0170377 A1 * | 7/2007 | Nakano | 250/504 R |

FOREIGN PATENT DOCUMENTS

| | | |
|---|---|---|
| EP | 1 367 445 A1 | 12/2003 |
| JP | 62-117246 | 5/1987 |
| JP | 02-100297 | 4/1990 |
| JP | 07-167998 | 7/1995 |
| JP | H07-167998 A | 7/1995 |
| JP | 11-312638 | 11/1999 |
| JP | 2000-56099 | 2/2000 |
| JP | 2001-023795 A | 1/2001 |
| JP | 2005-276673 A * | 10/2005 |
| JP | 2006-085940 | 3/2006 |
| WO | WO 2004/062050 A2 | 7/2004 |

OTHER PUBLICATIONS

Electron-Beam, X-Ray, EUV, and Ion-Beam Submicrometer Lithographies for Manufacturing V, John M. Warlaumont, vol. 2437, Proceedings of SPIE, Feb. 20-21, 1995.

Extended Abstracts (The 65$^{th}$ Autumn Meeting, 2004); The Japan Society of Applied Physics, No. 2, Apr. 1, 2004.

European Search Report dated Mar. 17, 2008 for International Application No. PCT/JP2005024221, 18 pages.

Komori, H. et al., "Laser-produced-plasma light source development for extreme ultraviolet lithography," Journal of Vacuum Science & Technology, vol. B. 21, No. 6, pp. 2843-2847, Nov. 2003.

* cited by examiner

LASER CONVERGENT DIAMETER
←100nm

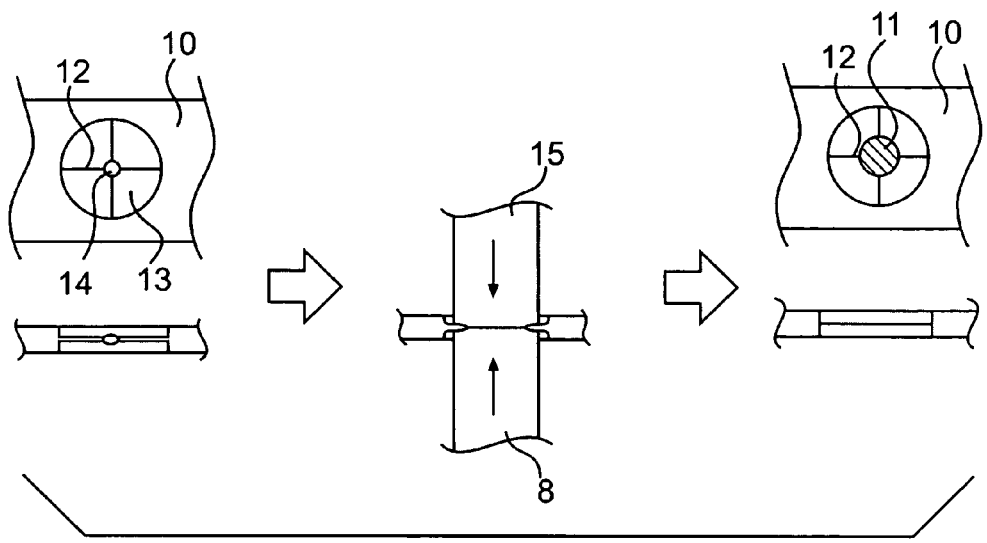
FIG. 6
FIG. 7A
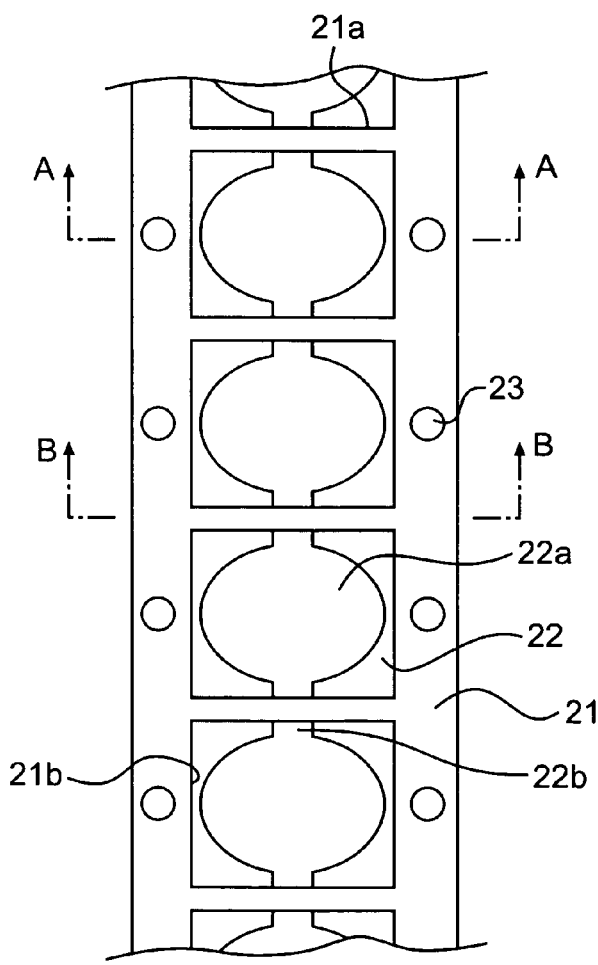
FIG. 7B
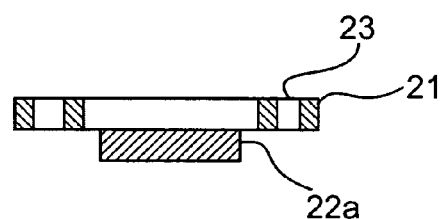
FIG. 7C
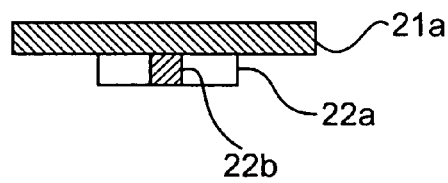

LASER PLASMA EUV LIGHT SOURCE, TARGET MATERIAL, TAPE MATERIAL, A METHOD OF PRODUCING TARGET MATERIAL, A METHOD OF PROVIDING TARGETS, AND AN EUV EXPOSURE DEVICE

FIELD OF THE INVENTION

The present invention concerns a laser plasma EUV light source, target material ideal for use in an EUV exposure apparatus (also known as an extreme ultraviolet exposure apparatus, and it refers to an exposure apparatus using ultraviolet light of wavelength under 150 nm in the specification and claims), tape material, a method of producing target material, a method of providing targets, and an EUV exposure apparatus.

BACKGROUND OF THE INVENTION

In recent years, projection lithographic technology using EUV light having a shorter wavelength (11 to 14 nm) than that of conventional ultraviolet light has been developed to enhance the resolution of optical systems that are limited by the diffraction limit of light accompanying miniaturization of semiconductor integrated circuits. This technology in recent years has been called EUV (Extreme Ultraviolet) lithography. It is expected to be technology capable of providing resolution under 70 nm that had been impossible with conventional optical lithography using a light source of 190 nm wavelength.

The complex refractive index n of substance in the wavelength range of EUV light is represented by $n=1-\bar{c}-ik$ (i is the complex notation). Imaginary part k in this refractive index represents extreme ultraviolet absorption. Since $\bar{c}$ is far smaller than 1, the real part of the refractive index in this range is very close to 1. Furthermore, since k has a finite value in all substances, absorption must take place. Accordingly, an optical system that uses reflection is used since a transparent refractive optical component like a conventional lens cannot be used.

FIG. 11 presents an outline of the EUV exposure apparatus. EUV light 32 discharged from EUV light source 31 is incident to illumination optical system 33. It forms a virtually parallel luminous flux via concave mirror 34 that acts as a collimator mirror. It is then incident to optical integrator 35 comprising a pair of fly-eye mirrors 35a and 35b. The fly-eye mirror disclosed in the gazette of Japanese Kokai Publication Hei-11-312638, for example, can be used as the pair of fly-eye mirrors 35a and 35b. The detailed structure and function of the fly-eye mirror are explained in further detail in the gazette of Japanese Kokai Publication Hei-11-312638, and their explanation is omitted here since it is unrelated directly to the present invention.

A surface illuminant having a predetermined shape is formed near the reflecting surface of second fly-eye mirror 35b, specifically, near the emission surface of optical integrator 35. Light from the surface illuminant is polarized by plate mirror 36, followed by formation of an elongated, arc shaped illumination region on mask M (a depiction of the perforated plate used to form the arc shaped illumination region is omitted). Light from the pattern on mask M forms an image of the mask pattern on wafer W via projection optical system PL comprising a plurality of mirrors (six mirrors M1 to M6 shown in FIG. 11).

The optical system using such mirrors has a ring-shaped projection exposure field in which only aberration at a specific image height is compensated since it cannot compensate for overall aberration in the broad exposure field. The mask and wafer are scanned in synchronization and exposed since a 30 mm square chip cannot be exposed at once in a projection exposure field having such a ring shape.

A multi-layer film reflecting mirror is generally used as the reflecting mirror in such an EUV exposure apparatus. A multi-layer film is formed on a substrate, and the phase of very weak reflecting light at the interface is aligned and multiply overlapped to obtain high reflectance.

Reflectance of 67.5% at perpendicular incidence can be attained by using an Mo/Si multi-layer film in which a molybdenum (Mo) layer and a silicon (Si) layer are alternately laminated in the wavelength region near 13.4 nm while reflectance of 70.2% at perpendicular incidence can be attained by using an Mo/Be multi-layer film in which an Mo layer and a beryllium (Be) layer are alternately laminated in the wavelength region near 11.3 nm.

In light source which is commonly used as EUV light source 31, laser light is irradiated on target material as excitation light to convert the target material into plasma. The EUV light (exposure light) generated at that time is then used. Such an EUV light source is discussed in the gazette of Japanese Kokai Publication 2000-56099.

The use of Xe plasma (as both the laser plasma light source and the discharge plasma light source) has been extensively researched and developed as the EUV light source of 13.5 nm wavelength used in an EUV exposure apparatus. The reasons are that a comparatively high conversion efficiency (proportion of EUV light intensity attained relative to input energy) can be attained and that no problems arise associated with debris since the material is gaseous at ambient temperature. However, there are limits to how high a conversion efficiency can be realized because Xe is a gas, and the use of Sn as target material is known to be effective in attaining a higher conversion efficiency.

There is an electron temperature of ideal plasma for efficient generation of EUV light, and 50 eV is ideal. The electron temperature rises with increase in the irradiation intensity of laser light when the light source is laser plasma. The electron temperature rises excessively and X-rays of short wavelength are generated when the irradiation intensity is too high, thereby lowering the conversion efficiency from laser light to EUV light. Accordingly, there is an ideal laser irradiation intensity, which is about $10^{11}$ W/cm$^2$.

The laser spot diameter must be increased to elevate the EUV light output while retaining the ideal light irradiation intensity.

The size of the EUV light source is limited by the etendue (product of the cross-sectional area of a luminous flux and the solid angle). Etendue is the quantity retained in an optical system. When the product of the size (area) of the light source and the capture solid angle of a convergence optical system exceeds the etendue of a convergence optical system, the excess portion of EUV light cannot be captured in the optical system and is wasted. Consequently, a maximum allowable level of the size of the light source exists.

Accordingly, setting the light spot diameter to the maximum allowable level would be effective in maximumizing the output of an effective EUV light. For example, if the numerical aperture (NA) of a projection optical system were 0.25 (sin θ=0.25, or 0.2 sr when converted to a solid angle), the exposure field size were 2 mm×25 mm, and the δ value of illumination were 0.5, the etendue of this optical system would be 2×25×0.2×0.5=5 mm$^2$sr.

Assuming the capture solid angle of the convergence optical system to be π and the allowable light source size to be $5/\pi = 1.6$ mm$^2$, then the maximum allowable diameter of the light source would be 1.4 mm.

On the other hand, debris is a serious problem in an EUV light source using plasma. The reflectance falls markedly when debris adheres to the surface of a condenser mirror. Typical debris includes fragments of target material, large particles that solidify after once dissolution, ions generated in plasma, and neutral particles of atomic shape that have lost their charge due to the charge exchange collision of ions, and debris is found in various sizes.

The so-called limited mass target is an effective method of inhibiting debris comprising fragments of target material and large particles that solidify after once dissolution. This is a method that uses minimum material required for generating plasma. If all target material could be converted into plasma (ionized), the debris that was finely decomposed into atomic shape, including the neutral particles of atomic shape that have lost their charge due to the charge exchange collision of ions as well as ions generated in plasma, could be removed from the optical path by such aspects as a gas curtain, while debris of atomic shape that has a charge could be removed from the optical path by an electromagnetic field.

Examination of the thickness of target material required to form plasma following irradiation of laser light on a target confirmed a thickness under 100 nm to be adequate. Consequently, the providing of extremely flat target material of 100 nm thickness with a diameter of 1 mm (a value smaller than the 1.4 mm maximum diameter of the allowable light source) that is perpendicular to the incident direction of laser light would be effective in maximizing the EUV output while holding down the amount of debris generation in a laser plasma light source.

However, nothing that satisfies these requirements has been available in target providing methods considered to date. At present, the jet target method and the droplet target method are the methods of providing targets considered to be effective in inhibiting debris.

The jet target method is a aspect in which liquid target material is continuously sprayed in a vacuum from a nozzle to continuously provide an elongated columnar target that is solidified instantly due to adiabatic expansion. The droplet target method is a aspect in which target material is continuously sprayed from a nozzle to continuously provide target material that is spherical due to surface tension.

The target dimensions of these did not differ between the irradiation direction of laser light and the perpendicular direction in either target method, and the extremely flat ideal target shape was not obtained. Accordingly, the entire target could not be converted into plasma and the problems of residue generation due to debris could not be avoided.

SUMMARY OF THE INVENTION

The present invention was devised in view of these circumstances. The objective is to provide a laser plasma EUV light source that can output EUV light of adequate magnitude, target material that can be used in such a laser plasma EUV light source, a method of producing target material, a method of providing targets, and an EUV exposure apparatus that uses such an EUV light source.

The first aspect for resolving the issues is a laser plasma EUV light source that captures as output the EUV light that is generated through plasma conversion following irradiation of a target with laser light, wherein the target is a plate-shaped target having dimensions that are virtually equal with the convergent beam diameter of the laser light.

The power of the convergent light is effectively utilized, the conversion efficiency is elevated, and debris generation can be reduced in this aspect since a plate-shaped target having dimensions that are virtually equal with the convergent beam diameter of laser light is used as the target.

Virtually equal means that the size such that the debris generated poses no problems and it refers to the size in the range of 0.5 to 1.5—times the convergent beam diameter of the laser light. If the target is not round, the size of the circumscribed circle should be within this range. If laser light is incident to the target plane at an angle, the dimensions of the target projected onto a plane perpendicular to the optical axis of the laser light should be within the range.

The second aspect for resolving the issues is the light source of the first aspect in which the thickness of the plate-shaped target is not more than 1000 nm.

Virtually the entire target can be converted into plasma with little residue as a result of setting the target thickness at no more than 1000 nm, which thereby reduces the amount of debris generated.

The third aspect for resolving the issues is the light source of the second aspect in which the thickness of the plate-shaped target is not more than 100 nm.

Virtually the entire target can be converted into plasma with virtually no residue as a result of setting the target thickness at no more than 100 nm, which further reduces the amount of debris generated.

The fourth aspect for resolving the issues is the light source of any of the first to third aspects in which the shape of the plate-shaped target is circular viewed from the direction of EUV light output.

EUV light can be regarded as being generated from a circular light source since the shape of the plate-shaped target is circular when viewed from the direction of EUV light output in this aspect, and it can easily be handled in optical systems subsequently.

The fifth aspect for resolving the issues is the light source of any of the first to third aspects in which the material of the plate-shaped target is Sn or material containing compounds thereof.

Sn is ideal material because of its good conversion efficiency of EUV light having short wavelength of approximately 13.5 nm, and while it has a low melting point and is not very hard, it can easily be used to form very thin plate-shaped targets.

The sixth aspect for resolving the issues is the target used in the laser plasma EUV light source of any of the first to fifth aspects in which the plate-shaped target is held against tape by a support member in a hole of the tape.

The plate-shaped target can be easily provided and a very thin plate-shaped target can be provided at a stable position since the plate-shaped target is fixed in place against tape by a support member in a hole of the tape.

The seventh aspect for resolving the issues is tape material in which the plate-shaped material is held against tape by a support member in a hole of the tape.

This aspect can be used as the sixth aspect.

The eighth aspect for resolving the issues is the target used in any of the laser plasma EUV light sources of the first to fifth aspects in which the plate-shaped target that is connected by narrow material identical with that of the plate-shaped target is adhered to tape having a ladder shape. The plate-shaped target is located between the rungs of the ladder-shaped tape and the narrow material is located in the rung sections of the ladder-shaped tape.

The plate-shaped target can be easily provided and a very thin plate-shaped target can be provided at a stable position in this aspect as well.

The ninth aspect for resolving the issues is the tape material in which plate-shaped material that is connected by narrow material identical with that of the plate-shaped material is adhered to tape having a ladder shape. The plate-shaped material is located between the rungs of the ladder-shaped tape and the narrow material is located in the rung sections of the ladder-shaped tape.

This aspect can be used as the eighth aspect.

The tenth aspect for resolving the issues is the target used in any of the laser plasma EUV light sources of the first to fifth aspects in which target material is adhered to tape, wherein holes are opened at fixed intervals in the tape, tape from the opened sections remains removed, and the target material at the sections comprises the plate-shaped target.

The plate-shaped target can be easily provided and a very thin plate-shaped target can be provided at a stable position in this aspect as well.

The eleventh aspect for resolving the issues is the tape material to which material is adhered. Holes opened at fixed intervals therein and tape from the opened sections remain removed.

This aspect can be used as the tenth aspect.

The twelfth aspect for resolving the issues is the target or tape material of any of the sixth to eleventh aspects in which the tape is polyimide resin.

Polyimide resin does not suffer damage even if molten Sn should adhere since polymide resin has a comparatively high glass transition point. Therefore, tape rupture and tearing can be prevented.

The thirteenth aspect for resolving the issues is a method of producing the target of the sixth aspect in which a hole is formed in tape, a support member is formed in the hole so as to be supported by the tape, molten target material is dropped onto the support member and solidified, followed by pressing the solidified target material to a predetermined thickness.

The target material becomes virtually spherical due to surface tension when molten target material is dropped onto the support member and solidified in this aspect. A very thin disc-shaped target can be completed by pressing. Moreover, the disc-shaped target can be supported by a support member and fixed to the tape.

The fourteenth aspect for resolving the issues is the method of producing target of the eighth aspect in which tape with depressions established at fixed intervals is prepared and target material that comprises a film is deposited on the side of the tape without depressions, after which the target material that is connected by narrow material identical with that of the plate-shaped target is shaped by etching, followed by reducing the thickness of the tape by etching and opening a hole in the depression of the tape.

The fifteenth aspect for resolving the issues is a method of producing target of the tenth aspect in which tape with depressions established at fixed intervals is prepared and target material is deposited on the side of the tape without depressions, after which the thickness of the tape is reduced by etching and a hole is opened in the depression of the tape.

The sixteenth aspect for resolving the issues is the method of providing the target in the laser plasma EUV light source of any of the first to fifth aspects in which individual plate-shaped targets are each conveyed on a carrier gas and sprayed from a nozzle.

The plate-shaped target can be provided at the convergence point of laser light while in a stable position by this aspect.

The seventeenth aspect for resolving the issues is the method of providing the target in the laser plasma EUV light source of any of the first to fifth aspects in which a nozzle is vibrated and each of the plate-shaped targets is sprayed from the nozzle by the vibrating force.

The plate-shaped target can be provided at the convergence point of laser light while in a stable position by this aspect.

The eighteenth aspect for resolving the issues is the method of providing the target in the laser plasma EUV light source of any of the first to fifth aspects that uses the target of the sixth aspect, eighth aspect, or tenth aspect in which the tape is wound from a tape rewind apparatus about which the tape is wound to a tape winding apparatus that winds the tape, and the plate-shaped target is provided to the convergence point of laser light that is positioned between the rewind apparatus and the winding apparatus by winding the tape.

The plate-shaped target can be provided at the convergence point of laser light while in a stable position by this aspect.

The nineteenth aspect for resolving the issues is an EUV exposure apparatus that uses any of the laser plasma EUV light sources of the first to fifth aspects as the light source.

The throughput of exposure is enhanced in this aspect since high EUV output is obtained and contamination of the optical system by debris is reduced, thereby prolonging the maintenance cycle of the apparatus and reducing the maintenance costs.

BRIEF DESCRIPTION OF THE DRAWINGS

FIG. 6 is a drawing that shows one example of the method of producing tape targets shown in FIG. 5.

FIG. 7 is a drawing that shows the tape target used in the laser plasma EUV light source in the second embodiment of the present invention.

DETAILED DESCRIPTION OF THE INVENTION

The embodiment of the present invention is explained below using the drawings.

Figure 1:
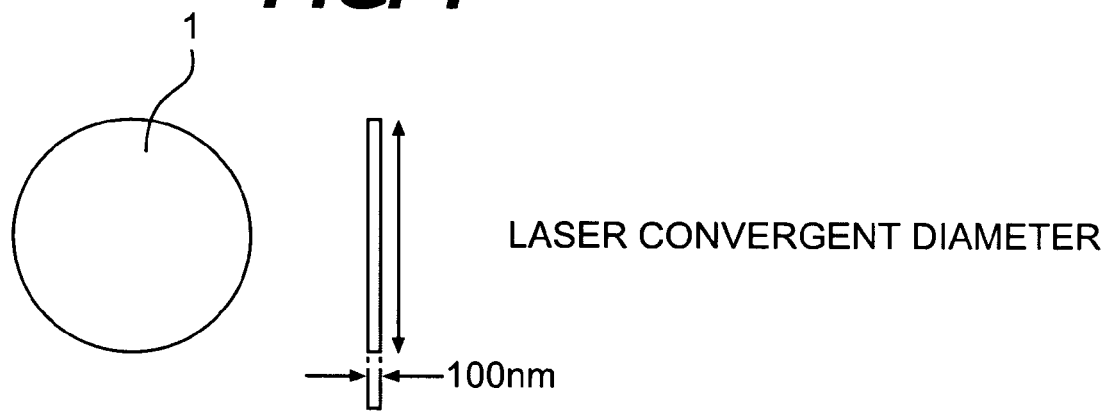
FIG. 1 is a drawing that shows a disc-shaped target used in the laser plasma EUV light source in one example of the embodiment of the present invention.

FIG. 1 is a drawing that shows an example of the target used in the laser plasma EUV light source in the first embodiment of the present invention. Target 1 is a disc-shaped target of 1 mm diameter and 100 nm thickness made of Sn. The mechanical strength falls if the thickness is under 100 nm, the target is easy to break and it is difficult to handle the target. The thickness may be increased to impart adequate mechanical strength but holding the thickness under 1000 nm is ideal from a viewpoint of debris removal.

Figure 2:
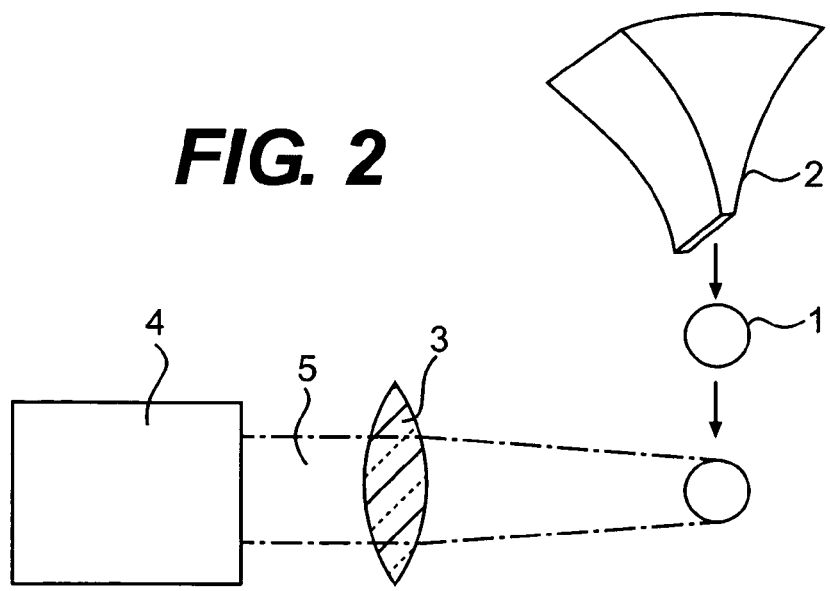
FIG. 2 is a drawing that shows the method of providing disc-shaped target 1 to the laser plasma EUV light source in the first embodiment of the present invention.

FIG. 2 is a drawing that shows the method of providing disc-shaped target 1 in the laser plasma EUV light source in the first embodiment of the present invention. Disc-shaped target 1 is sprayed from nozzle 2 that has a slit-shaped aperture and is arranged in the disc direction. Disc-shaped target 1 is conveyed on a gas stream. He gas is used in this example. Nozzle 2 may be vibrated by a piezo apparatus to spray disc-shaped target 1.

Target 1 that is sprayed from nozzle 2 reaches the irradiation position of laser light with its direction unchanged since the exterior of nozzle 2 is maintained in a high vacuum.

Synchronized with delivery of target 1, pulse laser light 5 of 1.06 μm wavelength from Nd:YAG light source 4 is focused by lens 3 and irradiated onto target 1. The spot diameter of the laser is the same 1 mm diameter as that of target 1. The irradiation intensity is adjusted so as to be virtually $1 \times 10^{11}$ W/cm$^2$. Consequently, the pulse intensity of the light is 80 J/pulse, and the pulse amplitude is 10 ns. Specifically, the irradiation intensity of laser light is $10^2$ J/mm$^2$/pulse, and the area of a 1 mm diameter disc is 0.785 mm$^2$, which results in 78.5 J/pulse.

The light source operates at 100 Hz repeating frequency with a mean output of 8 kW. EUV output exceeding 16 W (output at the emission point) can be attained with this light source since the Sn target attains conversion efficiency exceeding 2%. EUV output exceeding 160 W would be realized if the excitation light is intensified further with the mean output raised to 80 kW and the repeating frequency raised to 1 kHz.

Figure 3A:
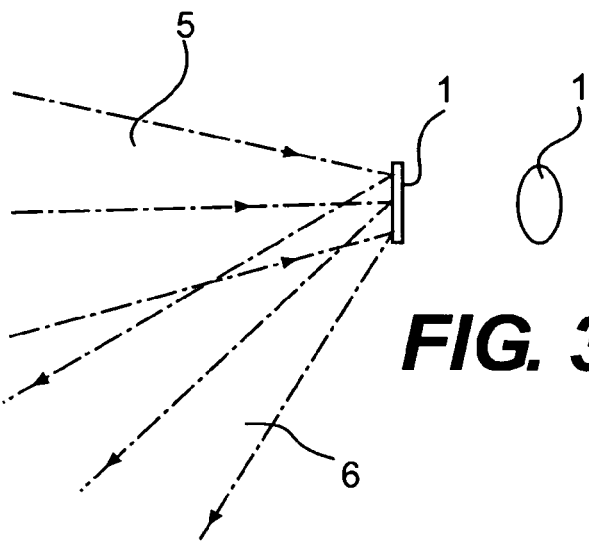
FIG. 3 is a drawing that shows the method of capturing EUV light.
Figure 3B:
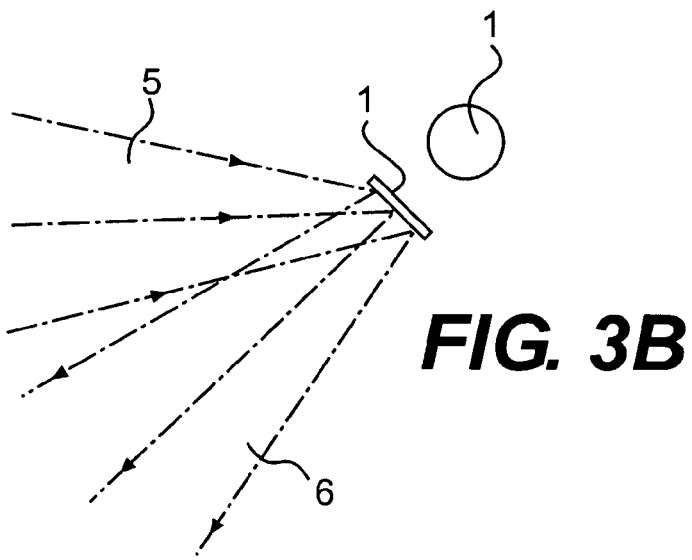
Figure 3C:
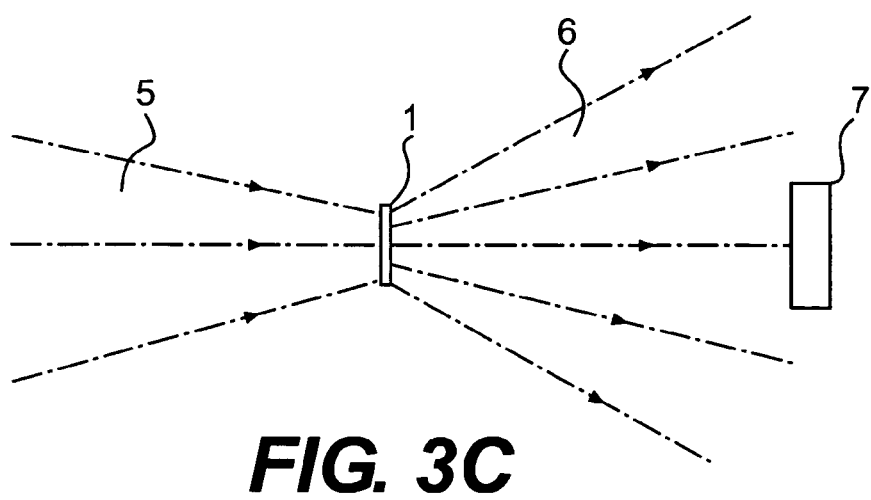

FIG. 3 is a drawing that shows the method of capturing EUV light. FIG. 3 (a) shows an example in which pulse laser light 5 is irradiated from the normal direction of target 1 and EUV light 6 is captured at the oblique direction relative to the normal line of the disc. In this case, the convergence spot of pulse laser light 5 with target 1 may adopt an axially-elongated oval shape so that the light source is round when viewed from the capturing direction of EUV light 6.

FIG. 3 (b) shows an example in which pulse laser light 5 is irradiated from the oblique direction relative to the normal line of target 1 and EUV light 6 is captured in the normal direction of target 1. In this case, the convergence spot of pulse laser light 5 may adopt an axially-elongated oval shape so that the light source is round when viewed from the capturing direction of EUV light 6. However, target 1 would preferably be round.

FIG. 3 (c) shows the method of capturing EUV light 6 from the reverse side of target 1 relative to the irradiation direction of laser light 5. An obliquely incident oval mirror or a Schwarzschild optical system are often used in the convergence optical system of EUV light 6, but both are optical systems with central shielding of the pupil, and EUV light near the center of the optical axis cannot be focused. Thus, beam stop 7 of laser light is arranged in this section to reduce laser light discharged from the EUV light source. An advantage of this method is that the light source is easily arranged on the EUV exposure apparatus since the optical axis of pulse laser light 5 is equal to the optical axis of EUV light 6.

Figure 4:
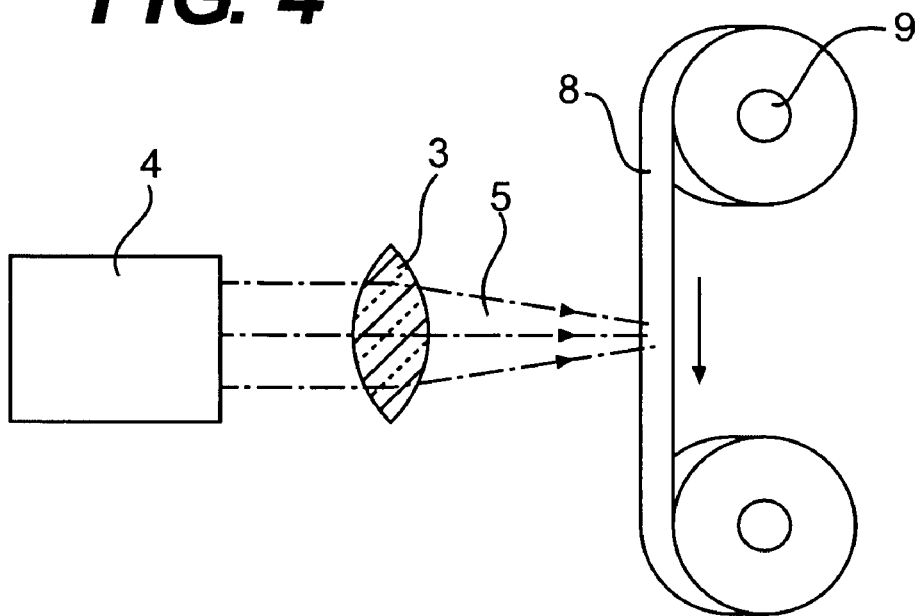
FIG. 4 is a drawing that shows the method of providing disc-shaped targets in a laser plasma EUV light source in the second embodiment of the present invention.

FIG. 4 shows the method of providing disc-shaped targets in a laser plasma EUV light source in the second embodiment of the present invention. Tape target 8 in tape form is continuously provided by target drive mechanism 9 in this embodiment. Laser light 5 generated by laser light source 4 is focused by lens 3 and irradiated onto tape target 8. So-called tape target 8 itself has long been known, but tape target 8 having a different structure from the conventional structure is used in this embodiment.

Figure 5A:
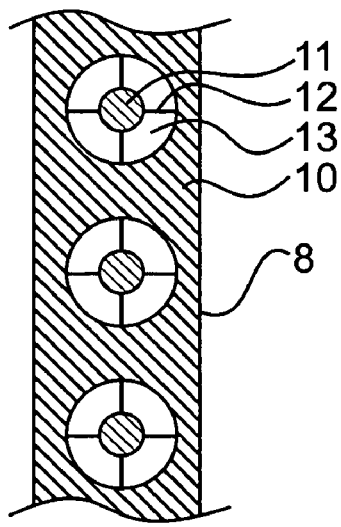
FIG. 5 is a drawing that shows the tape target used in the laser plasma EUV light source in the second embodiment of the present invention.
Figure 5B:
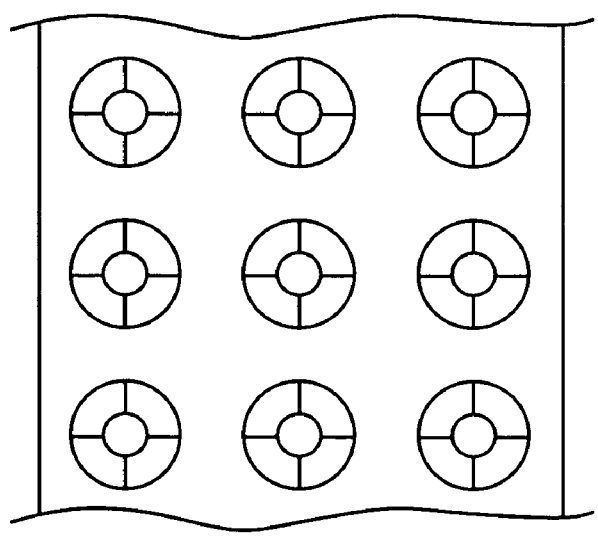
Figure 8A:
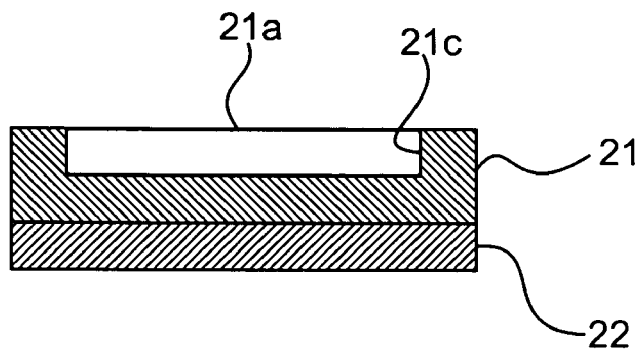
FIG. 8 is a drawing that shows one example of the method of producing tape targets shown in FIG. 7.
Figure 8B:
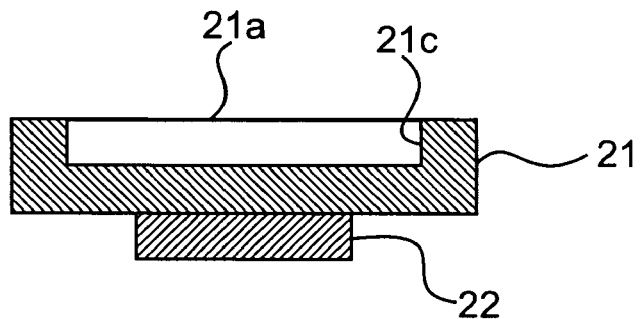
Figure 8C:
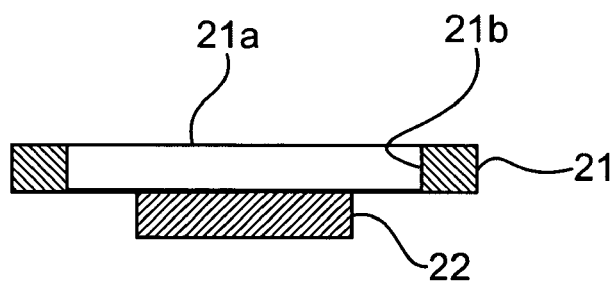
Figure 8D:
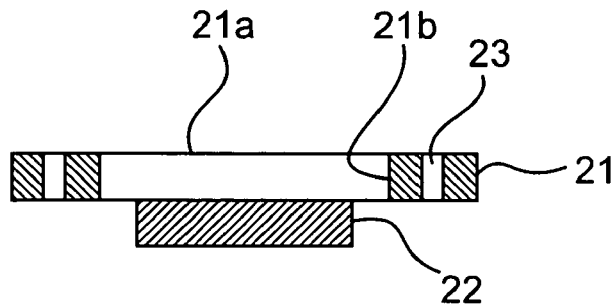

FIG. 5 (a) shows the structure of such a tape target 8. Polyimide resin is used in tape substrate 10. Each hole 13 is opened in tape substrate 10 and each disc-shaped target 11 is installed via supporting structures 12 in the center of each hole 13.

Disc-shaped target 11 is made of Sn and is 100 nm thick. The diameter of disc-shaped target 11 is set at 1 mm so as to be virtually equal to the convergent beam diameter of laser light. The diameter of hole 13 is sufficiently larger than the convergent beam diameter of laser light and virtually no damage from laser light irradiation reaches tape substrate 10. The diameter here is 5 mm. The width of tape substrate 10 is 10 mm.

Virtually no thermal contact is made between disc-shaped target 11 and tape substrate 10 since supporting structure 12 is sufficiently thin, and disc-shaped target 11 virtually floats in a space. There are four supporting structures 12 in this drawing, but any number of three or more is permissible.

Synchronized with delivery of tape target 8 in FIG. 4, pulse laser light 5 of 1.06 μm wavelength from Nd:YAG light source 4 is focused by lens 3 and irradiated onto disc-shaped target 11. The spot diameter of the laser is the same 1 mm diameter as that of target 1. The irradiation intensity is adjusted so as to be virtually $1 \times 10^{11}$ W/cm$^2$. Consequently, the pulse intensity of the light is 80 J/pulse, and the pulse amplitude is 10 ns. Therefore, the output is similar to that obtained in the first embodiment.

A series of disc-shaped targets 11 is arranged in FIG. 5 (a), but a plurality of rows may be arranged, as shown in FIG. 5 (b), and one tape target may be used a plurality of times.

FIG. 6 is a drawing that shows one example of the method of producing such tape targets. Hole 13 and supporting structure 12 are preformed in polyimide resin tape substrate 10, followed by adhesion of target material 14 of predetermined mass to the center of supporting structure 12. Sn is used in target material 14 here.

A predetermined mass only of Sn that has been liquified by heating to melt can be dropped in place since Sn is metal with a comparatively low melting point (231.9° C.). Polyimide resin is not damaged even if molten Sn is adhered since it is resin with a comparatively high glass transition point. Sn that had been dropped in the center of supporting structure 12 congeals into a sphere through surface tension and solidifies.

Next, pressure is applied from both sides of tape to complete pressing of target material 14 adhered to supporting structure 12. A tape target provided with disc-shaped target 11 in the center of supporting structure 12 can be constructed in this manner. The thickness of disc-shaped target 11 can be adjusted by the pressure in pressing.

FIG. 7 is a drawing that shows another example of the structure of such a tape target 8. FIG. 7 (a) is a planar figure, (b) is an A-A cutaway drawing, (c) is a B-B cutaway drawing.

Polyimide resin is used in tape substrate 21. Tape substrate 21 has a ladder shape as shown in FIG. 7 (a). On the other hand, target 22 has a structure in which disc-shaped targets 22a are connected by narrow sections 22b. Narrow section 22b is affixed to section 21a corresponding to the rungs of the ladder of tape substrate 21, by means of which target 22 is supported on tape substrate 21.

Disc-shaped target 22a is positioned in the center of section 21a corresponding to the rungs of the ladder of tape substrate 21 so as to lie in section 21b which is devoid of tape substrate 21. Therefore, even if disc-shaped target 22a is irradiated with laser light, any damage caused by laser light irradiation would not affect tape substrate 21. Reference numeral 23 denotes a hole that is opened in tape substrate 21. The timing of laser light irradiation is determined by detecting the position of this hole.

FIG. 8 is a drawing that shows the step of producing the tape targets shown in FIG. 7. It shows the section corresponding to A-A profile in FIG. 7. Film of target 22 material is formed by sputtering on the side without depression 21c of tape substrate 21 upon which is formed section 21c that excludes section 21a corresponding to the rungs (a). Material of target 22 is etched in the shape shown in FIG. 7. Subsequently, the entire thickness is reduced by etching tape substrate 21 to form hole 21b. in part of depression 21c (c). Finally, hole 23 is formed in the tape substrate (d).

Figure 9A:
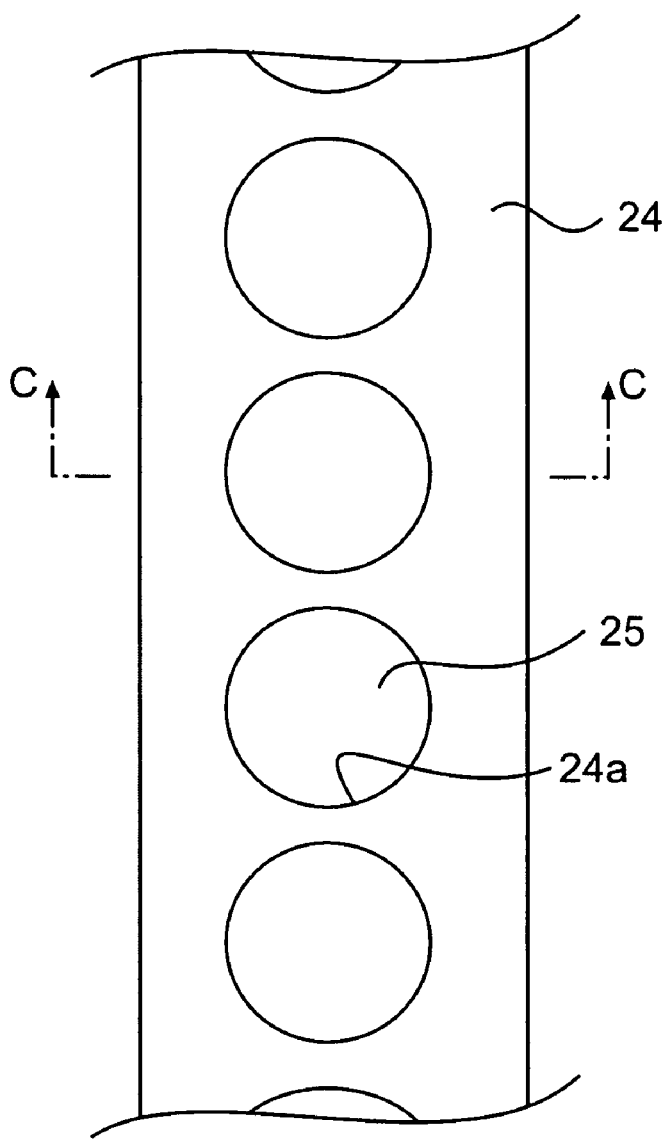
FIG. 9 is a drawing that shows the tape target used in the laser plasma EUV light source in the second embodiment of the present invention.
Figure 9B:
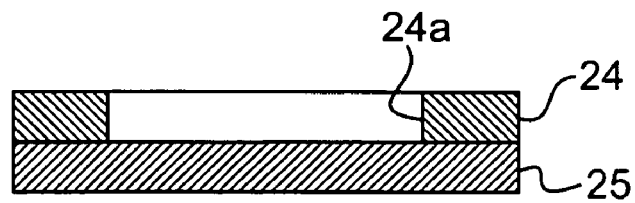

FIG. 9 is a drawing that shows another example of the production of tape target 8. FIG. 9 (a) is a planar figure, and FIG. 9 (b) is a cutaway drawing along C-C in FIG. 9 (a).

Polyimide resin is used for tape substrate 24. Film of target material 25 is formed on tape substrate 24. Furthermore, holes 24a are formed at fixed intervals in tape substrate 24. Target material is exposed in part of tape substrate 24 and it plays the role of a plate-shaped target following irradiation by laser light of this section.

Figure 10A:
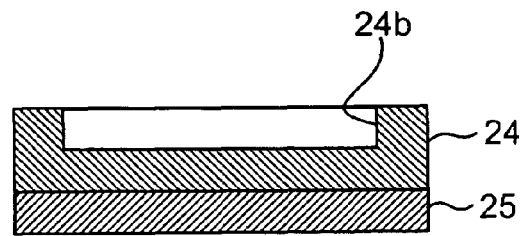
FIG. 10 is a drawing that shows one example of the method of producing tape targets shown in FIG. 9.
Figure 10B:
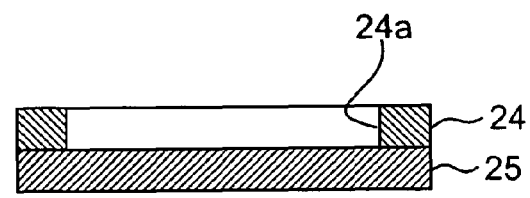

FIG. 10 is a drawing that shows the step of producing of the tape targets shown in FIG. 9. It shows the portion corresponding to profile C-C in FIG. 9. Film of target 25 material is formed by sputtering on the side without depression 24b of tape substrate 24 upon which is formed depression 24b at fixed intervals (a). Subsequently, the entire thickness is reduced by etching tape substrate 24 to form hole 24a in part of depression 24b (b).

Sn metal is used as target material in the embodiment, but the same effects would be realized even if material containing elemental Sn were used. For example, compounds such as tin oxide ($SnO_2$) may be used, as well as plastic resin in which fine Sn particles are dispersed.

Figure 11:
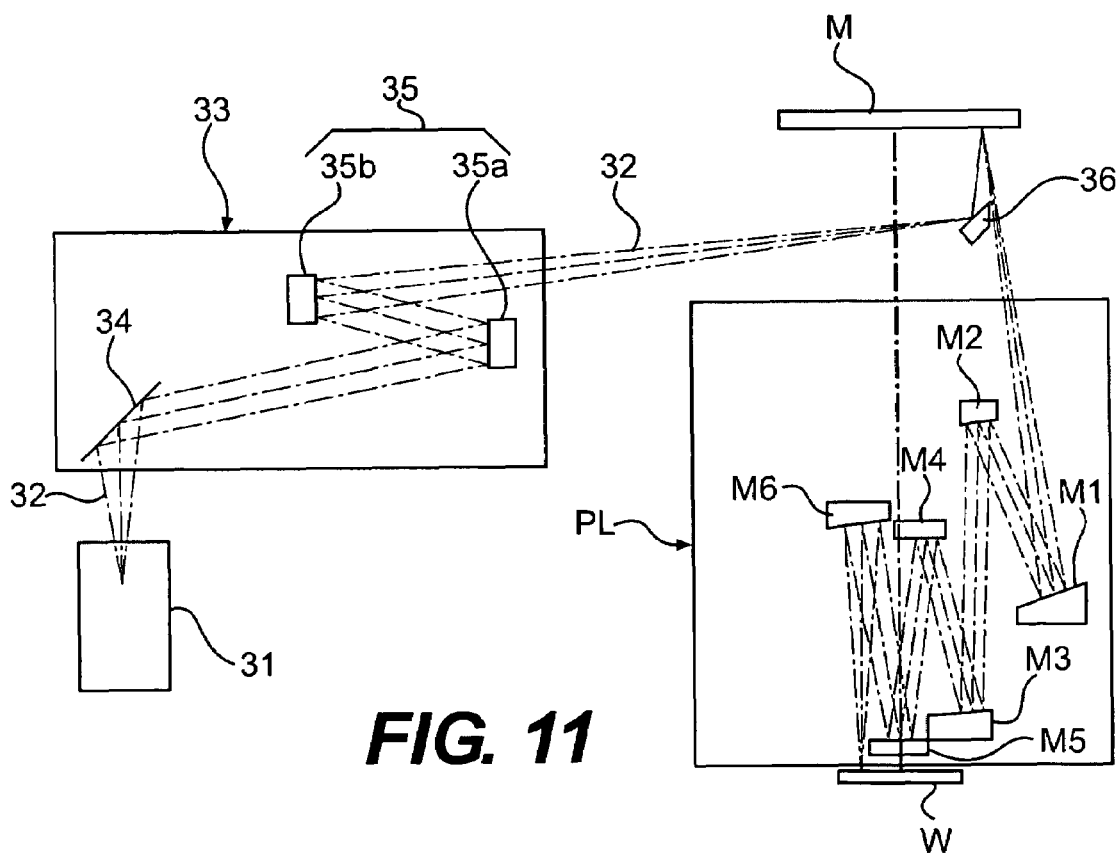
FIG. 11 is a drawing that shows an outline of the EUV exposure apparatus.

The EUV exposure apparatus in the embodiment of the present invention has the basic structure of a conventional apparatus shown in FIG. 11, with the sole difference lying in the use of the laser plasma EUV light source pursuant to the present invention. Consequently, an explanation of the apparatus is omitted.

The invention claimed is:

1. A laser plasma EUV light source for outputting EUV light generated through plasma conversion following irradiation of a target with laser light, the laser plasma EUV light source comprising:
   a laser;
   a target comprising a plate-shaped target having diameters that are equal or almost equal to the convergent beam diameter of the laser light, wherein the thickness of the plate-shaped target is less than 1000 nm;
   tape; and
   a support member in a hole of the tape holding the plate-shaped target against the tape.

2. The laser plasma EUV light source of claim 1 wherein the thickness of the plate-shaped target is not more than 100 nm.

3. The laser plasma EUV light source of claim 1 wherein the shape of the plate-shaped target is circular viewed from the direction of EUV light output.

4. The laser plasma EUV light source of claim 1 wherein the plate-shaped target is Sn or a material containing compounds of Sn.

5. The laser plasma EUV light source of claim 1 wherein the tape comprises polyimide resin.

6. Tape material used in a light source, the tape material comprising light-generating plate-shaped material and a support member in a hole of the tape holding the light-generating plate-shaped material against the tape.

7. The tape material of claim 6 in which the tape is polyimide resin.

8. The laser plasma WV light source of claim 1 in which the plate-shaped target is connected by narrow material that is identical with that of the plate-shaped target and is adhered to tape having a ladder shape, wherein the plate-shaped target is located between the rungs of the ladder-shaped tape and the narrow material is located in the rung sections of the ladder-shaped tape.

9. The laser plasma EUV light source of claim 8 in which the tape is polyimide resin.

10. Tape material used in a light source, the tape material comprising: light-generating plate-shaped material; narrow material identical with that of the plate-shaped material connected to the plate-shaped material; and tape having a ladder shape, wherein the plate-shaped material is adhered to the tape and is located between the rungs of the ladder-shaped tape, and wherein the narrow material is located in the rung sections of the ladder-shaped tape.

11. The tape material of claim 10 in which the tape is polyimide resin.

12. The laser plasma EUV light source of claim 1 further comprising target material and tape, wherein holes are opened at fixed intervals in the tape, and the target material is adhered to portions of the tape that are in the holes of the intervals, and wherein the target material comprises the plate-shaped target.

13. The laser plasma EUV light source of claim 12 in which the tape is polyimide resin.

14. Tape material used in a light source comprising light-generating material adhered to tape, wherein the tape comprises holes opened at fixed intervals.

15. The tape material of claim 14 in which the tape is polyimide resin.

16. A method of producing the target of claim 1 by forming a hole in tape, forming a support member in the hole so as to be supported by the tape, dropping and solidifying molten target material onto the support member, and pressing the solidified target material to a predetermined thickness.

17. A method of producing the target of claim 8 by establishing depressions at fixed intervals in the tape, depositing target material on the side of the tape without depressions, connecting the target material with a narrow material identical with that of the plate-shaped target by etching, reducing the thickness of the tape by etching, and opening a hole in the depression of the tape.

18. A method of producing the target of claim 12 by establishing depressions at fixed intervals, depositing target material on the side of the tape without depressions, reducing the thickness of the tape by etching, and opening a hole in the depression of the tape.

19. A method of providing the target in the laser plasma EUV light source of claim 1 in which individual plate-shaped targets are each conveyed on a carrier gas and sprayed from a nozzle.

20. A method of providing the target in the laser plasma EUV light source of claim 1 in which a nozzle is vibrated and each of the plate-shaped targets is sprayed from the nozzle by the vibrating force.

21. A method of providing a plate-shaped target in a laser plasma EUV light source for outputting EUV light generated through plasma conversion following irradiation of the target with laser light, wherein the plate-shaped target is held against a tape by a support member in a hole of the tape, the method comprising the steps of unwinding the tape from a tape rewind apparatus about which the tape is wound to a tape winding apparatus that winds the tape, and providing the plate-shaped target to the convergence point of laser light that is positioned between the rewind apparatus and the winding apparatus by winding the tape.

22. A method of providing a plate-shaped target in a laser plasma EUV light source for outputting EUV light generated through plasma conversion following irradiation of a target with laser light, wherein the plate-shaped target is connected to tape by a narrow material, wherein the tape has a ladder shape and the plate-shaped target is located between the rungs of the ladder-shaped tape and the narrow material is located in the rung sections of the ladder-shaped tape, the method comprising unwinding the tape from a tape rewind apparatus about which the tape is wound to a tape winding apparatus that winds the tape, and providing the plate-shaped target to the convergence point of laser light that is positioned between the rewind apparatus and the winding apparatus by winding the tape.

23. A method of providing a plate-shaped target in a laser plasma EUV light source for outputting EUV light generated through plasma conversion following irradiation of a target with laser light, wherein target material is adhered to a tape, the tape comprises holes opened at fixed intervals, and the plate-shaped target comprises target material in the holes opened at fixed intervals, the method comprising unwinding the tape from a tape rewind apparatus about which the tape is wound to a tape winding apparatus that winds the tape, and providing the plate-shaped target to the convergence point of laser light that is positioned between the rewind apparatus and the winding apparatus by winding the tape.

24. An EUV exposure apparatus that uses the laser plasma EUV light source of claim 1 as the light source.

25. The tape material of claim 6, wherein the light source in which the tape material is used is a laser plasma EUV light source.

26. The tape material of claim 10, wherein the light source in which the tape material is used is a laser plasma EUV light source.

27. The tape material of claim 14, wherein the light source in which the tape material is used is a laser plasma EUV light source.

28. The tape material of claim 6 wherein the thickness of the light-generating plate-shaped material is less than 1000 nm.

29. The tape material of claim 6 wherein the thickness of the light-generating plate-shaped material is not more than 100 nm.

30. The tape material of claim 10 wherein the thickness of the light-generating plate-shaped material is less than 1000 nm.

31. The tape material of claim 10 wherein the thickness of the light-generating plate-shaped material is not more than 100 nm.

32. The tape material of claim 14 wherein the thickness of the light-generating material is less than 1000 nm.

33. The tape material of claim 14 wherein the thickness of the light-generating material is not more than 100 nm.

34. A laser plasma EUV light source for outputting EUV light generated through plasma conversion following irradiation of a target with laser light, the laser plasma EUV light source comprising:
a laser; and
a target comprising distributed plate-shaped targets having diameters that are equal to or almost equal to the convergent beam diameter of the laser light, wherein the thicknesses of the plate-shaped targets are less than 1000 nm.

35. The laser plasma EUV light source of claim 34, further comprising a nozzle supplying the target.

36. The laser plasma EUV light source of claim 34, wherein the thickness of the plate-shaped target is not more than 100 nm.

37. The laser plasma EUV light source of claim 34, wherein the shape of the plate-shaped target is circular viewed from the direction of EUV light output.

38. The laser plasma EUV light source of claim 34, wherein the plate-shaped target is Sn or a material containing compounds of Sn.

39. The laser plasma EUV light source of claim 34, wherein the target is supplied on a gas stream.

* * * * *

UNITED STATES PATENT AND TRADEMARK OFFICE
CERTIFICATE OF CORRECTION

PATENT NO. : 7,456,417 B2  Page 1 of 1
APPLICATION NO. : 11/329116
DATED : November 25, 2008
INVENTOR(S) : Katsuhiko Murakami and Hideya Inoue It is certified that error appears in the above-identified patent and that said Letters Patent is hereby corrected as shown below:

Claim 8, column 10, line 7, "WV" should read --EUV--.

Signed and Sealed this

Seventeenth Day of February, 2009

JOHN DOLL
*Acting Director of the United States Patent and Trademark Office*